United States Patent
Barghouthi et al.

(10) Patent No.: US 11,271,537 B2
(45) Date of Patent: Mar. 8, 2022

(54) INTERFACE CIRCUITS

(71) Applicant: SOCIONEXT INC., Yokohama (JP)

(72) Inventors: Atheer Sami Barghouthi, Maidenhead (GB); Saul Darzy, Maidenhead (GB)

(73) Assignee: SOCIONEXT INC., Yokohama (JP)

( * ) Notice: Subject to any disclaimer, the term of this patent is extended or adjusted under 35 U.S.C. 154(b) by 464 days.

(21) Appl. No.: 16/410,437

(22) Filed: May 13, 2019

(65) Prior Publication Data

US 2020/0007104 A1 Jan. 2, 2020

(30) Foreign Application Priority Data

Jun. 29, 2018 (EP) .................................... 18181015

(51) Int. Cl.
*H03H 7/00* (2006.01)
*H02H 9/04* (2006.01)
*H03H 7/01* (2006.01)

(52) U.S. Cl.
CPC .............. *H03H 7/00* (2013.01); *H02H 9/046* (2013.01); *H03H 7/0115* (2013.01); *H03H 7/0138* (2013.01)

(58) Field of Classification Search
CPC ...... H03H 7/00; H03H 7/0115; H03H 7/0138; H02H 9/046; H03M 1/124; H03M 1/66
USPC .............................................. 361/56; 326/30
See application file for complete search history.

(56) References Cited

U.S. PATENT DOCUMENTS

| 8,181,140 | B2 | 5/2012 | Kireev et al. |
| 9,391,451 | B1 | 7/2016 | Ransijn |
| 2007/0188265 | A1* | 8/2007 | Perreault ................ H03H 7/427 333/181 |
| 2010/0277256 | A1* | 11/2010 | Concord ................ H03H 7/427 333/177 |
| 2014/0355171 | A1* | 12/2014 | Gupta .................. H03H 7/1758 361/270 |

OTHER PUBLICATIONS

Extended European Search Report of related European Patent Application No. 18181015.1, dated Dec. 11, 2018.
Lin, S., et al., "Pi Coil: A New Element for Bandwidth Extension", IEEE Transactions on Circuits and Systems-II: Express Briefs, IEEE, US, vol. 56, No. 6, pp. 454-458, Jun. 2009.
(Continued)

*Primary Examiner* — Kevin J Comber
(74) *Attorney, Agent, or Firm* — Arent Fox LLP (57) ABSTRACT

An interface circuit, comprising: a signal line having signal, auxiliary and connection nodes defined therealong, the connection node for connection to a transmission line; signal-handling circuitry connected to the signal line at the signal node; an auxiliary circuit connected to the signal line at the auxiliary node; a signal pair of inductors connected in series along the signal line adjacent to and either side of the signal node; and an auxiliary pair of inductors connected in series along the signal line adjacent to and either side of the auxiliary node, wherein: the signal pair of inductors are configured to have a mutual coupling defined by a coupling coefficient kS; the auxillary pair of inductors are configured to have a mutual coupling defined by a coupling coefficient kA; and kS has a positive value and kA has a negative value.

20 Claims, 6 Drawing Sheets

(56) References Cited

OTHER PUBLICATIONS

Galas, S., et al., "Broadband esd protection circuits in cmos technology", IEEE Journal of Solid-State Circuits, IEEE Service Center, Piscataway, NJ, USA, vol. 38, No. 12, pp. 2334-2340, Dec. 2003.
Reiha, M., ei al., "Symmetric Monolithic T-coils for Broadband IC Design", Microwave Symposium, 2007. IEEE/MTT-S International, IEEE, PI, pp. 1909-1912, Jun. 2007.
Beyene, W., et al., "Return loss characterization and analysis of high-speed serial interface", 2016 IEEE Electrical Design of Advanced Packaging and Systems (EDAPS), IEEE, p. 203-206, Dec. 14, 2016.
Jin, J., et al.. "A 40-GB/s Transimpedance Amplifier in 0.18-m CMOS Technology", IEEE Journal of Solid-State Circuits, IEEE Service Center, Piscataway, NJ, USA, vol. 43. No. 6, pp. 1449-1457, Jun. 2008.

\* cited by examiner

INTERFACE CIRCUITS

CROSS-REFERENCE TO RELATED APPLICATION

This application claims priority from European Patent Application No. 18181015.1 filed Jun. 29, 2018. The entire contents of the prior application are incorporated herein by reference.

The present invention relates to interface circuits, for example forming part or all of an output stage (driver) and/or an input stage (receiver) of signal processing circuitry.

Such an output stage, for example of a digital-to-analogue converter (DAC), may be configured to drive a signal (i.e. an analogue signal) over a transmission line. Such an input stage, for example of an analogue-to-digital converter (ADC), may be configured to receive or recover a signal (i.e. an analogue signal) from a transmission line. Interface circuits may thus form part of a DAC or ADC. DACs and ADCs are of course merely convenient examples of signal processing circuitry. Interface circuits and circuitry comprising them may be implemented as integrated circuitry, for example on are IC chip.

Interface circuits in the context of an output stage may thus comprise driver circuitry along with additional circuitry for connection to a transmission line. Interface circuits in the context of an input stage may thus comprise buffering circuitry along with additional circuitry for connection to a transmission line.

Existing interface circuits have been found to be unsatisfactory, particularly in the context of high-speed input and output stages where wideband performance is key. With increasing speeds of e.g. DACs and ADCs, there is ever increasing pressure on performance of interface circuits.

According to an embodiment of a first aspect of the present invention, there is provided an interface circuit, comprising: a signal line having signal, auxiliary and connection nodes defined therealong, the connection node for connection to a transmission line; signal-handling circuitry connected to the signal line at the signal node so that an effective capacitance of the signal-handling circuitry is experienced (e.g. presented or applied) at the signal node; an auxiliary circuit connected to the signal line at the auxiliary node so that an effective capacitance of the auxiliary circuit is experienced (e.g. presented or applied) at the auxiliary node; a signal pair of inductors connected in series along the signal line (e.g. immediately) adjacent to and either side of the signal node; and an auxiliary pair of inductors connected in series along the signal line (e.g. immediately) adjacent to and either side of the auxiliary node, wherein: the signal pair of inductors are configured to have a mutual coupling defined by a coupling coefficient kS; the auxiliary pair of inductors are configured to have a mutual coupling defined by a coupling coefficient kA; for each said pair of inductors, the inductors of the pair are arranged such that a current flowing along the signal line in a given direction through one of those inductors induces a current in the other one of those inductors and flowing in the same direction along the signal line given a positive coupling coefficient; and kS has a positive value and kA has a negative value.

Such inductor arrangements can enable the effective capacitance of the signal-handling circuitry and of the auxiliary circuit to be compensated for to ensure wideband performance (taking into account a number of performance measures together, as explained later) of circuitry comprising the interface circuit.

In alternative arrangements, kS and kA may have other polarities. That is, in other arrangements kS and kA may both have positive values, or kS and kA may both have negative values. In other arrangements kS and kA may simply have opposite polarities from one another—i.e. kS may have a positive value and kA may have a negative value, or kS may have a negative value and kA may have a positive value in those arrangements. Such other combinations of polarities may have particular associated advantages.

The auxiliary node may be defined along the signal line between the signal and connection nodes; and/or the signal pair of inductors may be connected along the signal line (e.g. immediately) adjacent to the auxiliary pair of inductors; and/or the auxiliary pair of inductors may be connected along the signal line (e.g. immediately) adjacent to the connection node.

The auxiliary circuit may be an electrostatic discharge protection circuit. For example, the auxiliary circuit may comprise a network of diodes.

The coupling coefficients kS and kA may both have a magnitude greater than 0.1; and/or the coupling coefficients kS and kA both have a magnitude between 0.1 and 0.4. The performance may be particularly advantageous within these ranges.

The effective capacitance of the signal-handling circuitry may be larger than the effective capacitance of the auxiliary circuit, the inductances of the signal pair of inductors may be larger than the inductances of the auxiliary pair of inductors, and the magnitude of kS may be greater than the magnitude of kA. For example, the effective capacitance of the signal-handling circuitry may be at least twice the effective capacitance of the auxiliary circuit, the inductances of the signal pair of inductors may be at least twice the inductances of the auxiliary pair of inductors, and the magnitude of kS may be at least twice the magnitude of kA.

The connection node may be configured as a signal pad, such as a bond pad.

The signal line may further have a termination node defined therealong, and the interface circuit may comprise a termination resistor connected to the signal line at the termination node. The termination node may be defined along the signal line on the opposite side of the signal node from the auxiliary node.

For example, the termination resistor, signal-handling circuit and auxiliary circuit may each be connected between the relevant node of the signal line and ground (e.g. RF ground).

It may be that bridging capacitors are not provided to bridge each of the pairs of inductors.

The interface circuit may be a differential circuit comprising positive and negative said signal lines each having its own set of said nodes and pairs of inductors, for connection to a differential transmission line at the connection nodes of the positive and negative signal lines. The coupling coefficients for the pairs of inductors of the positive signal line may have the same polarities as the corresponding coupling coefficients for the corresponding pairs of inductors of the negative signal line.

For example, the termination resistor, signal-handling circuit and auxiliary circuit may each be connected between the relevant nodes of the positive and negative signal lines.

The coupling coefficients for the pairs of inductors of the positive signal line may be substantially the same as the corresponding coupling coefficients for the corresponding pairs of inductors of the negative signal line.

The signal-handling circuitry may be connected to the positive and negative signal lines at their signal nodes; and the auxiliary circuit may be connected to the positive and negative signal lines at the auxiliary nodes of those signal lines.

The signal-handling circuitry may be: driver circuitry for driving an output signal on the signal line or on the positive and negative signal lines; and/or buffer circuitry for receiving an input signal from the signal line or from the positive and negative signal lines.

According to an embodiment of a second aspect of the present invention, there is provided a signal transmission system, comprising: a transmission line having first and second ends; a first interface circuit being an interface circuit of the aforementioned first aspect of the present invention and connected to the transmission line at its first end; and a second interface circuit being an interface circuit of the aforementioned first aspect of the present invention and connected to the transmission line at its second end.

That is, the first interface circuit may be an interface circuit comprising driver circuitry for driving an output signal on the signal line or on the positive and negative signal lines, and ultimately the transmission line, and the second interface circuit may be an interface circuit comprising buffer circuitry for receiving an input signal from the signal line or from the positive and negative signal lines, and ultimately from the transmission line.

According to an embodiment of a third aspect of the present invention, there is provided an output circuit for use in digital-to-analogue converter circuitry, the output circuit comprising the interface circuit of the aforementioned first aspect of the present invention.

According to an embodiment of a fourth aspect of the present invention, there is provided digital-to-analogue converter circuitry comprising the output circuit of the aforementioned third aspect of the present invention.

According to an embodiment of a fifth aspect of the present invention, there is provided an input circuit for use in analogue-to-digital converter circuitry, the input circuit comprising the interface circuit of the aforementioned first aspect of the present invention.

According to an embodiment of a sixth aspect of the present invention, there is provided analogue-to-digital converter circuitry comprising the input circuit of the aforementioned fifth aspect of the present invention.

According to an embodiment of a seventh aspect of the present invention, there is provided integrated circuitry such as an IC chip (e.g. flip chip) comprising the interface circuit of the aforementioned first aspect of the present invention, or the signal transmission system of the aforementioned second aspect of the present invention, or the output circuit of the aforementioned third aspect of the present invention, or the digital-to-analogue converter circuitry of the aforementioned fourth aspect of the present invention, or the input circuit of the aforementioned fifth aspect of the present invention, or the analogue-to-digital converter circuitry of the aforementioned sixth aspect of the present invention.

Reference will now be made, by way of example, to the accompanying drawings, of which.

By way of introduction, in wideband output stages (drivers) and input stages (receivers) it is desirable to achieve both wideband transfer gain (S21) and wideband return loss (S22/S11). S21, S22 and S11 here are S-parameters (or scattering parameters) as would be recognised by the skilled person.

Typically, in the context of integrated circuitry, an electrostatic-discharge (ESD) protection circuit is provided in relation to the connection to the transmission line and adds to the parasitic capacitance of the driving or buffering circuitry, and this can degrade S11 and S21 performance. Existing interface circuits which attempt to compensate for the additional parasitic capacitance have a strong trade-off between performance in S21 and S22/S11 i.e. improving the S22/S11 degrades the S21 and vice versa. It is desirable to provide an interface circuit where good or improved wideband performance is achieved for both S21 and S22/S11.

Embodiments of the present invention enable the trade-off between S22/S11 and S21 to be weaker, i.e. enabling better bandwidth performance when both S22/S11 and S21 are taken into account. Taking the output stage as an example, embodiments of the present invention additionally equalize for any roll off caused by preceding stages (e.g. in a DAC) by "peaking" the transfer characteristic of the circuit (as will become apparent later).

Embodiments of the present invention could be applied to the output stage (driver) or the input stage (receiver) of a wideband system where both the S22/S11 and the S21 need to be wideband. As above, a high-speed DAC to ADC system is one convenient example. Embodiments could be provided as a semiconductor circuit, for example implemented in 16 nm technology. It will be appreciated that in the embodiments disclosed herein an advantage of the circuit is that it utilises a passive structure that comprises coupled inductors. Continuing the DAC and ADC example, an interface circuit disclosed herein may form part of a DAC output stage or an ADC input stage.

Figure 1A:
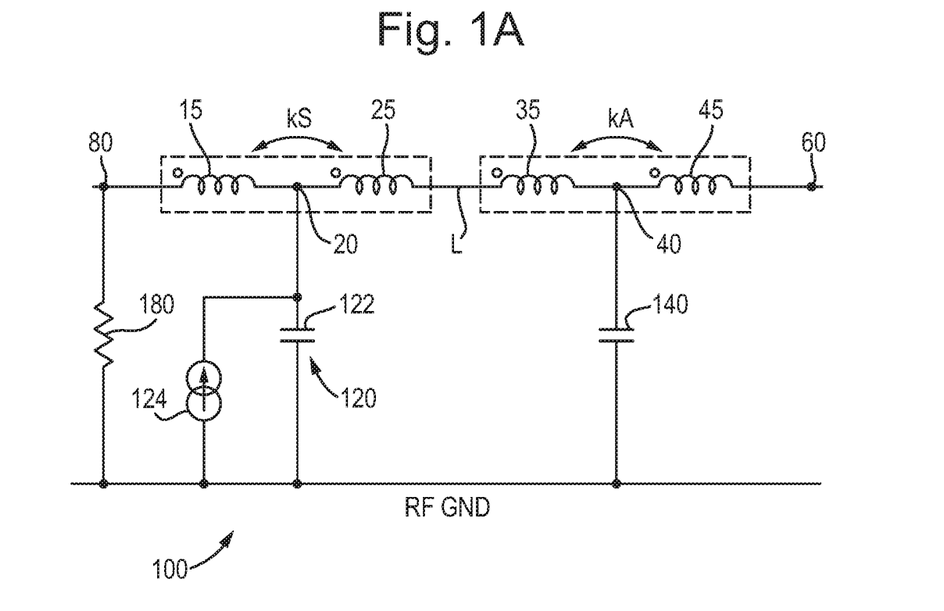
FIG. 1A is a schematic diagram of an interface circuit.

FIG. 1A is a schematic diagram of an interface circuit 100, which for example may form part or all of the output stage (driver) of a high-speed DAC.

It is emphasised that the interface circuit 100 is presented in FIG. 1 in simplified form, i.e. as an equivalent circuit representative of an actual interface circuit. The present disclosure will be understood accordingly.

Interface circuit 100 comprises a signal line L, signal-handling circuitry 120, an auxiliary circuit 140 and a termination resistor 180. Signal line L comprises a signal node 20, an auxiliary node 40, a connection node 60, a termination node 80, a signal pair of inductors 15 and 25, and an auxiliary pair of inductors 35 and 45.

The interface circuit 100 shown in FIG. 1A is to be implemented in an output stage (driver) as mentioned above. Signal-handling circuitry 120 thus comprises driver circuitry 124 here represented by a (variable) current source. A (parasitic) capacitance experienced or presented at the signal node 20 due to the driver circuitry 124 is explicitly represented by a capacitor 122. Signal-handling circuitry 120 is shown connected between the signal node 20 and ground GND (which may here be considered to be representative of RF GND) in the equivalent circuit 100.

The auxiliary circuit 140 is represented by a capacitor, again to represent the (parasitic) capacitance experienced or presented at the auxiliary node 40 due to the auxiliary circuit 140. The auxiliary circuit 140 may be, for example, ESD protection circuitry, but may be any circuitry that presents a capacitance at the auxiliary node 40. The auxiliary circuit 140 may be referred to as ESD protection circuitry 140 herein for convenience. The auxiliary circuit 140 is shown connected between the auxiliary node 40 and ground GND (RF GND), again to show the effect of the capacitance at the auxiliary node 40. Of course, ESD protection circuitry corresponding to the auxiliary circuit 140 may be implemented as a pair of diodes connecting the signal line L to ground and supply voltage sources, respectively, as will be known to the skilled person.

The connection node 60 is for connection to a transmission line, and may for example be a signal or bond pad. The termination resistor 180 is connected between the termination node 80 and ground GND (RF GND). Typically the termination resistor 180 may have a 50Ω value for matching with a 50Ω transmission line and a corresponding 50Ω input stage.

The signal pair of inductors 15 and 25 could readily be described as a T-coil. The signal pair of inductors 15 and 25 are connected together in series along the signal line L, and adjacent to and either side of the signal node 20. The signal pair of inductors 15 and 26 are configured to have a mutual coupling defined by a coupling coefficient kS.

Similarly, the auxiliary pair of inductors could readily be described as a T-coil. The auxiliary pair of inductors 35 and 45 are connected together in series along the signal line L, and adjacent to and either side of the auxiliary node 40. The auxiliary pair of inductors 35 and 45 are configured to have a mutual coupling defined by a coupling coefficient kA.

The signal and auxiliary pairs of inductors 15 and 25, and 35 and 45, are connected and arranged so that kS has positive polarity (i.e. has a positive value) and kA has negative polarity (i.e. has a negative value). This particular configuration is advantageous for good wideband performance for both S21 and S22/S11. In other arrangements, the mutual coupling coefficients could have other combinations of polarities as is explained later with reference to FIGS. 3-5. It will become apparent from FIGS. 3-5 that other particular combinations of polarities of kS and kA may be chosen based on other considerations (i.e. considerations other than achieving good wideband performance for both S21 and S22/S11). The meaning of polarities in this sense will be explained later.

Signal-handling circuitry 120 generates a current and drives a signal on the signal line L and the transmission line (not shown).

In the example where the auxiliary circuit 140 is representative of ESD protection circuitry, such ESD protection circuitry is provided to protect the driver circuitry 120 from damage due to electrostatic discharge. However, the auxiliary circuit 140 appears effectively as a capacitance. In previously-considered interface circuits the auxiliary circuit 140 is provided such that its capacitance appears effectively in parallel with the capacitor 122 (i.e. increasing the effective capacitance of the driver circuitry 124 and degrading performance). However, in contrast, in the interface circuit 100 the auxiliary circuit 140 appears at the auxiliary node 40 along with the inductor pair 35, 45 (rather than at the signal node 20) and as such the capacitances of the driver circuitry 124 and auxiliary circuit 140 are divided out and distributed. This has enabled the effect of the capacitance of both the driver circuitry 120 and the auxiliary circuit 140 to be better compensated for and enabled better performance of circuitry in which the interface circuit 100 is incorporated.

The parameters of the interface circuit 100 are chosen such that the interface circuit (including the signal and auxiliary pairs of inductors 15 and 25 and 35 and 45, the auxiliary circuit 140, the signal-handling circuitry 120 and the termination resister 180) exhibits a compensatory effect across a wide range of frequencies when compared with previously-considered compensation techniques, in particular improved bandwidth performance when both S22/S11 and S21 are taken into account. That is, it has been found that the degradation in performance of circuitry in which the interface circuit 100 is incorporated may be reduced (to an acceptable level across a wide range of frequencies) due to the interaction of components of the interface circuit 100, provided appropriate values are chosen for particular parameters (in particular, the coupling coefficients kS and kA).

Figure 1B:
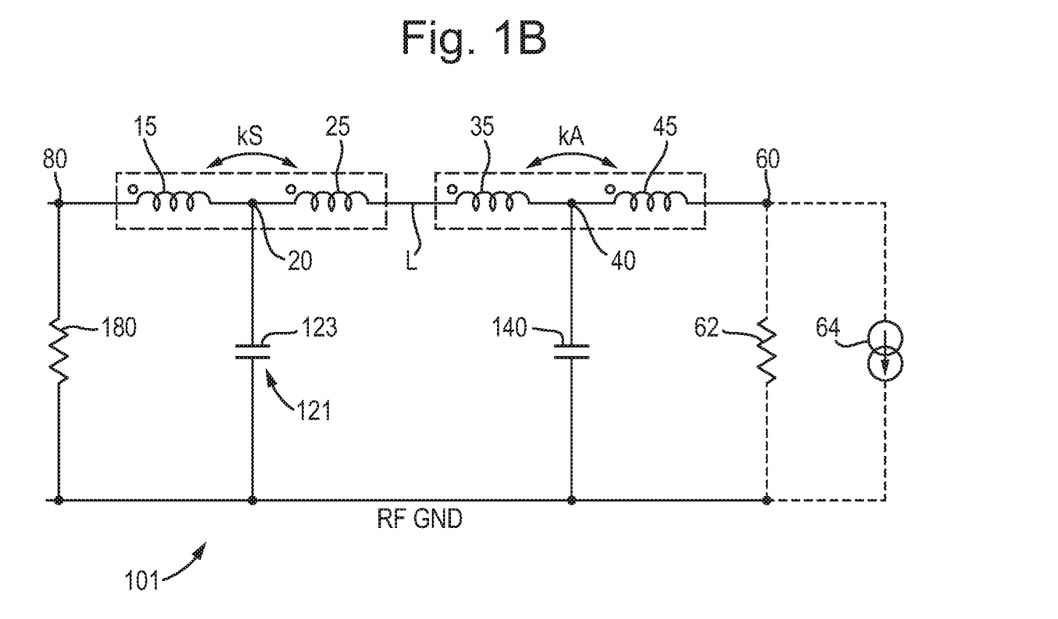
FIG. 1B is a schematic diagram of an interface circuit.

FIG. 1B is a schematic diagram of an interface circuit 101. Since the interface circuit 101 is similar to the interface circuit 100 shown in FIG. 1A and described above, duplicate description will be omitted where possible. Components the same as those in the interface circuit 100 of FIG. 1A have been given the same reference signs.

The interface circuit 101 is to be implemented in an input stage (i.e. a stage that receives a signal from a transmission line). The interface circuit 101 comprises the same components as the interface circuit 100, except that the signal-handling circuitry 120 is replaced by the signal-handling circuitry 121. The signal-handling circuitry 121 is circuitry configured to receive signals (for example signal-handling circuitry 121 may be representative of buffer circuitry). A capacitance experienced (presented or exhibited) at the signal node 20 due to the signal-handling circuitry 121 is represented by capacitor 123.

The circuitry shown with dashed lines in FIG. 1B (representative resistor 62 and representative driver 64) shows circuitry that could be used (for example in a simulation) to represent a driver-stage and transmission line to be connected at connection node 60.

It would be possible to provide circuitry corresponding to both of FIGS. 1A and 1B, i.e. as a transceiver where the signal-handling circuitry can operate both as the signal-handling circuitry 120 and the signal-handling circuitry 121 (for example, in different modes of operation). The present disclosure will be understood accordingly.

The dot convention used in FIGS. 1A and 1B will now briefly be explained with reference to FIG. 1A. If a current were to flow out of one inductor (a first inductor) of a pair of inductors (e.g. one of the pair 15 and 25) from its dotted terminal, then the magnetic field generated therefrom would have an effect on the other inductor (a second inductor) of that pair in a direction so as to induce a current to flow out of the second inductor from its dotted terminal, provided the mutual coupling between the two inductors of the pair is such that the coupling coefficient is positive (i.e. has a positive value or polarity). If, instead, the mutual coupling between the two inductors of the pair were such that the coupling coefficient were negative (i.e. having a negative value or polarity), then the magnetic field generated from a current flowing out of the first inductor from its dotted terminal would have an effect on the second inductor so as to induce a current to flow into the second inductor from its dotted terminal.

It will be appreciated that the dot convention used in FIGS. 1A and 1B is somewhat arbitrary and an alternative convention could be used provided the overall polarity of the coupling within each pair of inductors is preserved. For example, each of the dots of the inductors 15, 25, 35 and 45 in FIG. 1 could be at the other side of its inductor, in which case the sign of the mutual coupling coefficients kS and kA may stay the same. As another example, considering a pair of inductors with mutual coupling of positive polarity and a pair of inductors with mutual coupling of negative polarity, instead of having the dots in the same relative positions in both of the pairs and having a positive mutual coupling coefficient for one of the pairs and a negative mutual coupling coefficient for the other pair, the mutual coupling coefficient of each pair could have the same sign and the relative positions of the dots could be changed in one of the pairs based on whether the polarity of the mutual coupling is positive or negative.

Using the dot convention shown in FIGS. 1A and 1B, the inductors 15, 25, 35 and 45 are configured and arranged so that kS is positive and kA is negative (as mentioned above; in other arrangements other polarities may be chosen).

A positive mutual coupling coefficient can have a value from 0 (i.e. no mutual coupling between the inductors) to 1 (i.e. if all the flux generated in an inductor is coupled to the other—that is, the maximum mutual coupling possible). Without the use of a core (i.e. as in a transformer) a positive mutual coupling coefficient (for example in the case of a T-coil as disclosed herein) may have value between 0 and approximately 0.5. The corresponding ranges for a negative mutual coupling coefficient are of course the same but negative.

The choice of the mutual coupling coefficients kS and kA is based on a number of factors. One such factor is the capacitance experienced or presented at the signal node 20 due to the driver circuitry 124 and the capacitance experienced or presented at the auxiliary node 40 due to the auxiliary circuit 140. In general, the larger the capacitance due to the driver circuitry 124 (i.e. the capacitor 122) the larger the inductances of the inductors 15, 25 should be (to compensate for this capacitance), and the larger the capacitance due to the auxiliary circuit 140 the larger the inductances of the inductors 15, 25 should be (to compensate for this capacitance). Further, in general for smaller inductors it can be difficult in practice to get good mutual coupling, so for smaller inductors the range of values for the positive mutual coupling coefficient may be smaller (e.g. 0 to 0.25) than for larger inductors (e.g. 0 to 0.5). The corresponding ranges for a negative mutual coupling coefficient are of course the same but negative.

In general, a value of above 0.1 (e.g. 0.15) for mutual coupling coefficient kS has been found to be advantageous in terms of wideband performance for both S21 and S22/S11, and a value of below −0.1 (e.g. −0.15) for mutual coupling coefficient kA has been found to be advantageous in terms of wideband performance for both S21 and S22/S11. In particular a value of 0.1 to 0.4 for mutual coupling coefficient kS has been found to be advantageous in terms of wideband performance for both S21 and S22/S11, and a value of −0.1 to −0.4 for mutual coupling coefficient kA has been found to be advantageous in terms of wideband performance for both S21 and S22/S11. Further, a value of approximately 0.3 or 0.35 for mutual coupling coefficient kS has been found to be advantageous, and a value of −0.1 or −0.15 for mutual coupling coefficient kA has been found to be advantageous. In certain arrangements it has been considered that capacitor 122 may have a bigger capacitance (e.g. double the capacitance) than capacitor 140. In such a case kS may be bigger than kA (in terms of the magnitudes of the values as above). Of course, in other arrangements capacitor 122 may have a smaller capacitance (e.g. half) than capacitor 140. In such a case, kS may be smaller than kA (in terms of the magnitudes of the values).

Figure 2A:
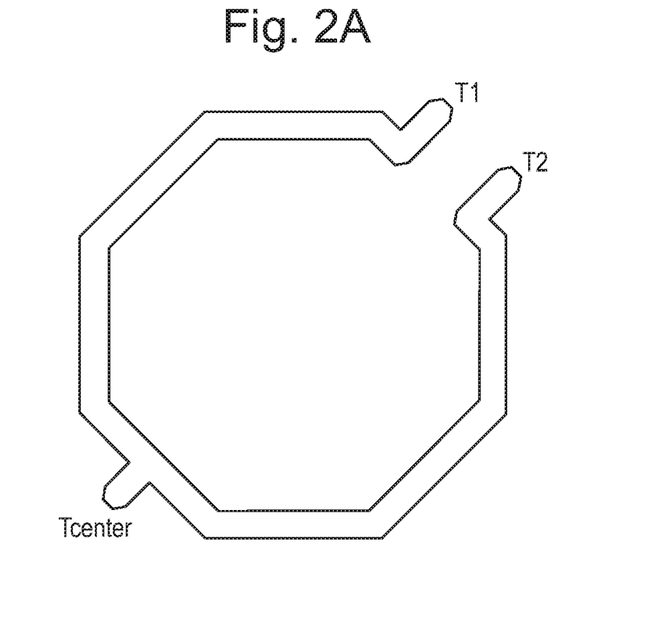
FIG. 2A is a schematic diagram of negatively-coupled inductors.

FIG. 2A is a schematic diagram of an example of a pair of inductors having a mutual coupling with negative polarity. That is, in accordance with the dot convention used in FIGS. 1A and 1B, the pair of inductors shown in FIG. 2A have a negative mutual coupling coefficient.

Each inductor comprises two terminals, and one of the terminals from one of the inductors is connected to one of the terminals from the other inductor to form the terminal Tcenter. The other terminals are labelled T1 and T2. The pair shown in FIG. 2A could be taken to be the signal pair of inductors 15 and 25, in which case the terminal Tcenter corresponds with the signal node 20 in FIGS. 1A and 1B. The pair shown in FIG. 2A could be taken to be the auxiliary pair of inductors 35 and 45, in which case the terminal Tcenter corresponds with the auxiliary node 40 in FIGS. 1A and 1B.

Figure 2B:
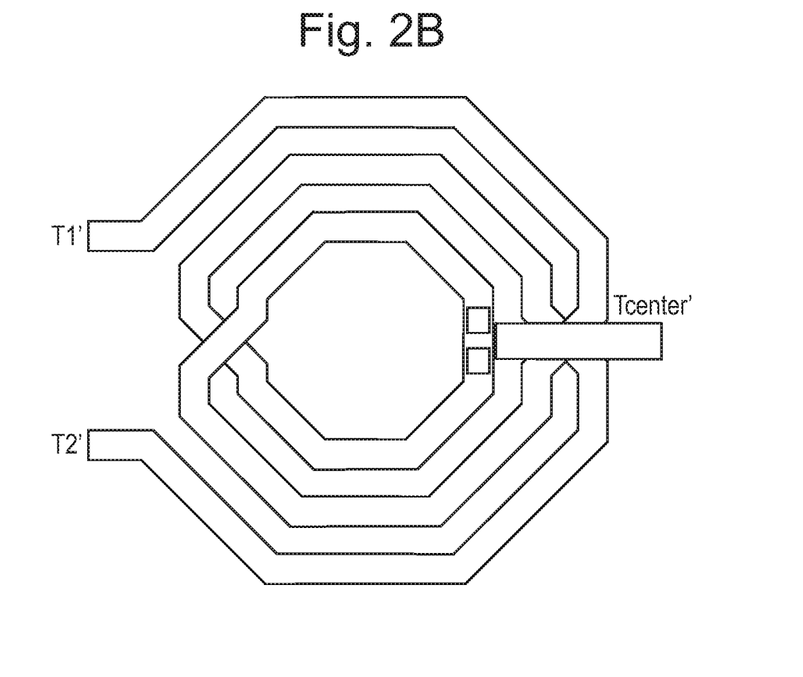
FIG. 2B is a schematic diagram of positively-coupled inductors.

FIG. 2B is a schematic diagram of an example of a pair of inductors having a mutual coupling with positive polarity. That is, in accordance with the dot convention used in FIGS. 1A and 1B, the pair of inductors shown in FIG. 2B have a positive mutual coupling coefficient.

Each inductor comprises two terminals, and one of the terminals of one of the inductors is connected to one of the terminals of the other inductor to form the terminal Tcenter'. The other terminals are labelled T1' and T2'. The pair shown in FIG. 2B could for example be taken to be the signal pair of inductors 15 and 25, in which case the terminal Tcenter' corresponds with the signal node 20 in FIGS. 1A and 1B. The pair shown in FIG. 2B could be taken to be the auxiliary pair of inductors 35 and 45, in which case the terminal Tcenter' corresponds with the auxiliary node 40 in FIGS. 1A and 1B.

The examples shown in FIGS. 2A and 2B are not exhaustive and it will be appreciated that there are many other possible configurations of inductor pairs configured to have a positive or a negative mutual coupling polarity.

The implementation of the interface circuit 100 and associated advantages will now be described.

The S-parameters mentioned earlier are measures of circuitry performance. Put simply, S21 is a measure of transfer gain (i.e. forward voltage gain) of a circuit, S11 is a measure of input port voltage reflection, and S22 is a measure of output port voltage reflection.

As mentioned above, the interface circuit 100 may be implemented in an output stage (driver)—i.e. the connection node 60 may be for connection to a transmission line to output a signal along the transmission line—and/or in an input stage (i.e. the connection node 60 may be for connection to a transmission line to receive a signal from along the transmission line). In any case, two S-parameters of interest for the output stage (driver) are S21 and S22, and two parameters of interest for the input stage are S21 and S11. According to the reciprocity theorem, the S21 value is the same from the point of view of the output stage and the input stage.

Generally, it is advantageous for S21 to be high and for S11 and/or S22 to be low across a wide range of operating frequencies. In a running example, it may be advantageous for S21 to be above −3 dB and for S11 and/or S22 to be below −12 dB across a wide range of frequencies. Generally, the wider the range of frequencies across which both S21 is above −3 dB and S11 and/or S22 is below −12 dB, the better the performance of circuitry in this running example.

The range of frequencies across which circuitry in which the interface circuit 100 is implemented has an S21 value above −3 dB and also an S22 and/or S11 value below −12 dB has been found to be wider than that of conventional circuitry when kS is positive and kA is negative, with the specific performance in a given arrangement being dependent on the parameters chosen (e.g. capacitances, resistances and inductances of the circuit components, as well as the exact values of kS and kA).

Figure 3:
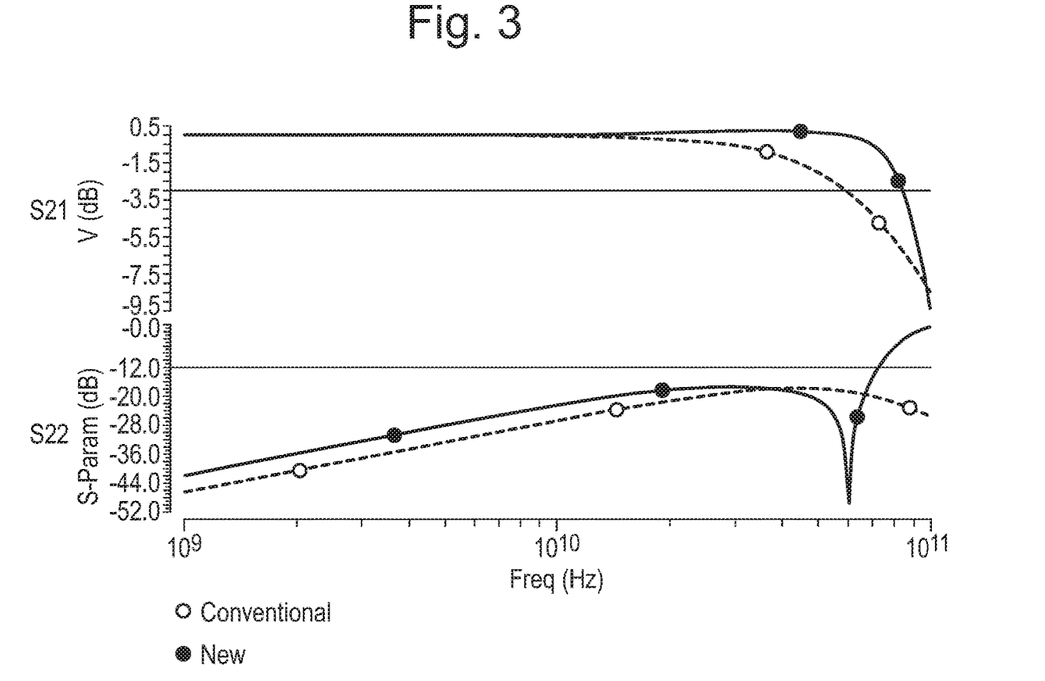
FIG. 3 is a graph showing how S-parameters vary with frequency for a particular implementation of an interface circuit and of conventional (or previously considered) circuitry.

FIG. 3 shows two graphs that show how the S21 and S22 parameters change with signal frequency, based on a simulation. The traces with the empty circles show the S-parameter performance for a conventional circuit, and the traces with filled circles show the same performance measured for a particular implementation of the interface circuit 100. The conventional circuit employed was different from the implementation of the interface circuit 100 in that the capacitor 140 was provided in parallel with the capacitor 122, the inductors 35 and 45 were not provided, and the T-coil formed by inductors 15 and 25 was bridged with a capacitor (as in a bridged T-coil). The levels of −3 dB for S21 and −12 dB for S22 (and S11) have been marked on to the graphs.

It can be seen that the S21 value for the conventional circuit falls below −3 dB at approximately 60 GHz, and that the S21 value for the interface circuit 100 falls below −3 dB at approximately 85 GHz. Similarly, the frequency at which the S22 value for the conventional circuit rises above −12 dB is at least 100 GHz (it is not shown on the graph), and the S22 value for the interface circuit 100 rises above −12 dB at approximately 70 GHz.

Thus the bandwidth (the range of signal frequencies with both an S21 value above −3 dB and an S22 value below −12 dB) for the conventional circuit is 60 GHz (0 GHz to 60 GHz), and the corresponding bandwidth for the interface circuit 100 is 70 GHz (0 GHz to 70 GHz). Thus, the interface circuit 100 has a wider bandwidth than the conventional circuit.

Figure 4A:
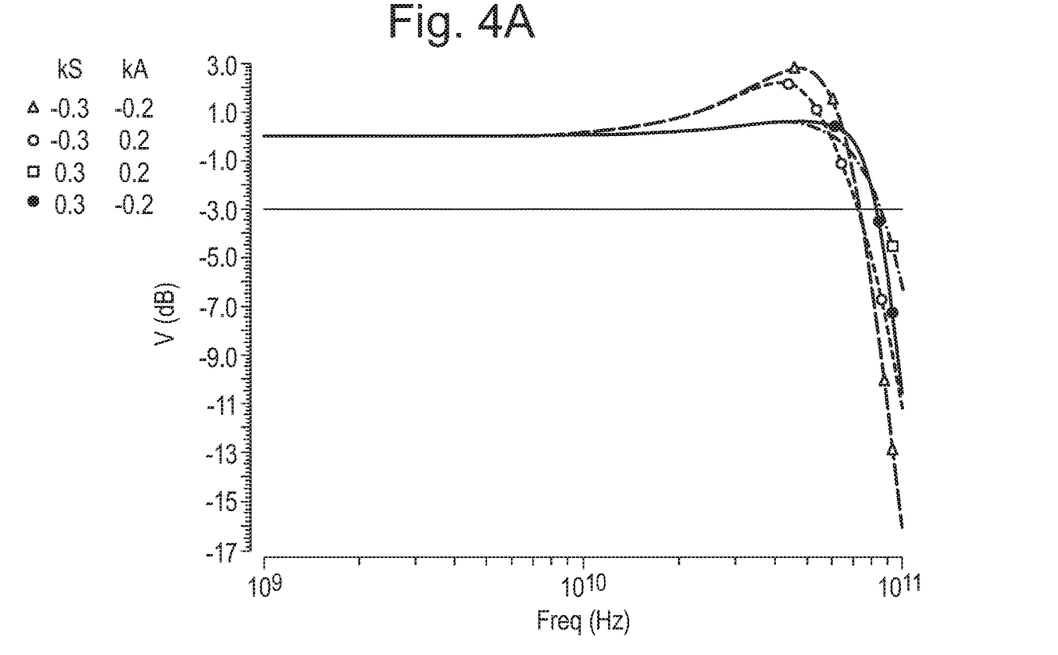
FIGS. 4A and 4B are graphs showing how S-parameters vary with frequency for particular implementations of an interface circuit.
Figure 4B:
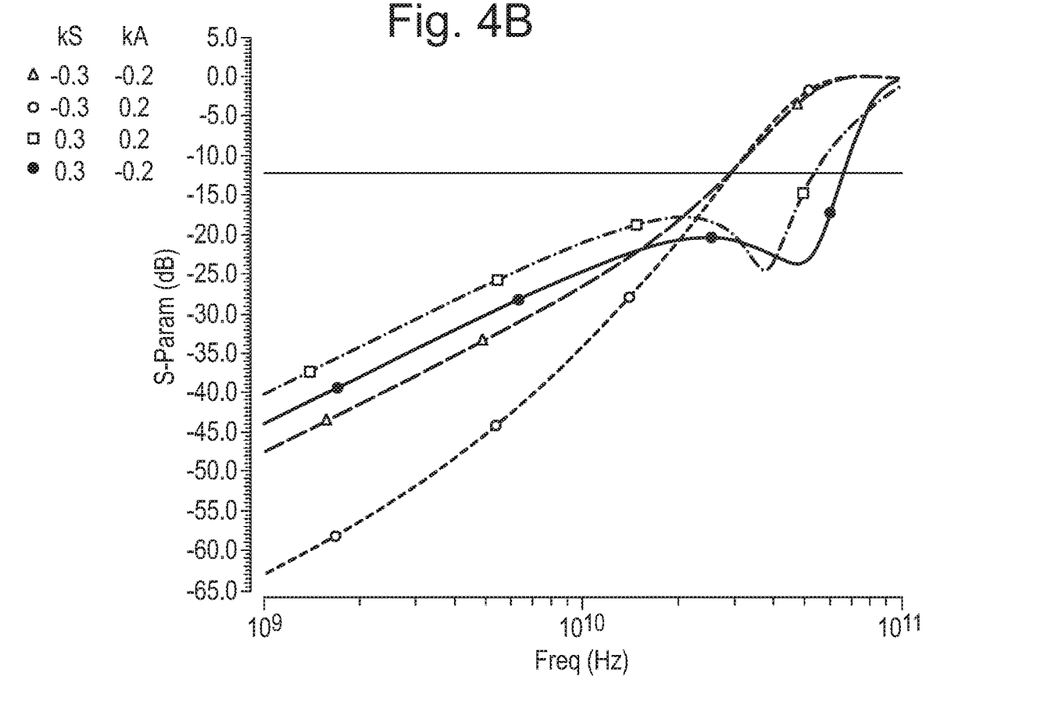

FIG. 4A is a graph that shows how the S21 parameter for particular implementations of the interface circuit 100 changes with signal frequency. FIG. 4B is a graph that shows how the S22 parameter for the same implementations of the interface circuit 100 changes with signal frequency.

In FIGS. 4A and 4B, the lines with the triangles show the S-parameters for a particular implementation of the interface circuit 100 in which kS is −0.3 and kA is −0.2, i.e. kS negative and kA negative. The lines with the empty circles show the S-parameters for a particular implementation of the interface circuit 100 in which kS is −0.3 and kA is 0.2, i.e. kS negative and kA positive. The lines with the squares show the S-parameters for a particular implementation of the interface circuit 100 in which kS is 0.3 and KA is 0.2, i.e. kS positive and kA positive. The lines with the filled circles show the S-parameters for a particular implementation of the interface circuit 100 in which kS is 0.3 and kA is −0.2, i.e. kS positive and kA negative.

In FIG. 4A the level of −3 dB for S21 has been marked on, and in FIG. 4B, the level of −12 dB for S22 (and S11) has been marked on. It can be seen from FIGS. 4A and 4B that the implementation that gives the widest bandwidth (the range of frequencies at which circuitry comprising the implementation of the interface circuit 100 can operate with an S21 value above −3 dB and with an S22 value below −12 dB) is the one in which the coupling coefficient kS is 0.3 and the coupling coefficient kA is −0.2 (this implementation has a bandwidth of approximately 65 GHz—the S21 parameter drops below −3 dB at approximately 90 GHz and the S22 parameter rises above −12 dB at approximately 65 GHz). That is, the implementation where kS is positive and kA is negative.

The interface circuit 100 can also give rise to "peaking" (mentioned earlier) in the transfer characteristic (forward voltage gain S21) of a circuit in which it is implemented. For example see FIG. 4A, in which the S21 graph peaks before dropping. In detail, given suitable parameters (e.g. the coupling coefficients, inductances, capacitances etc.), the forward voltage gain can increase at a frequency just below the frequency at which the forward voltage gain drops off (below the −3 dB threshold). This "peaking" can help to equalize or compensate for any "roll-off" caused by stages preceding the stage in which the interface circuit 100 is implemented. That is, the peaking effect of the interface circuit 100 can help to mitigate performance degradation caused by "roll-off".

Figure 5A:
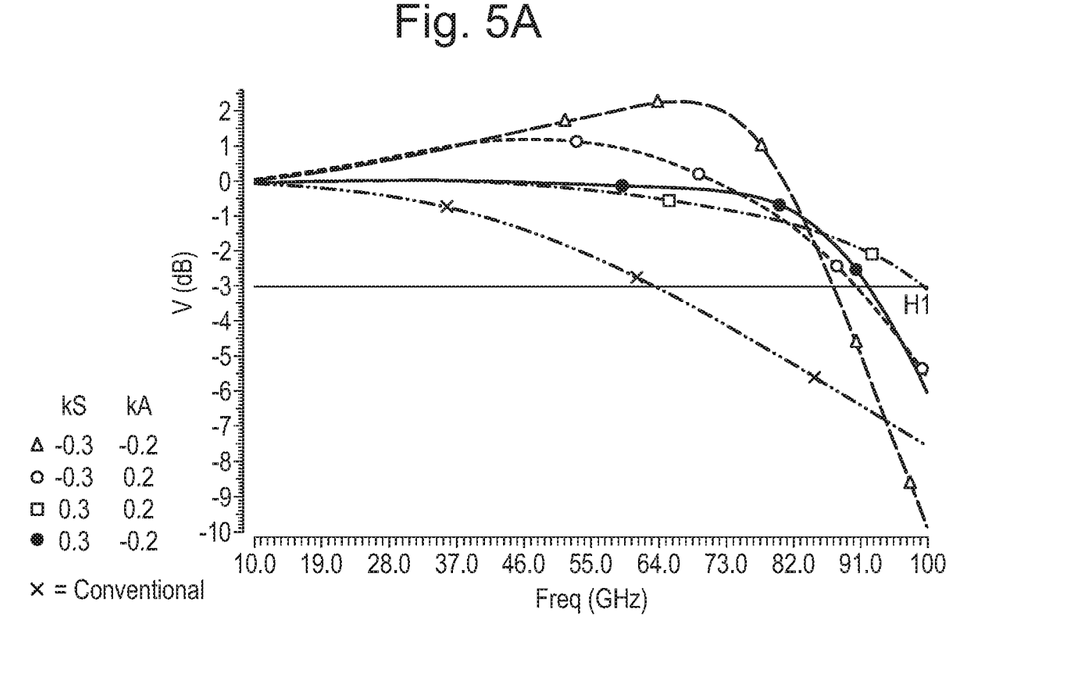
FIGS. 5A and 5B are graphs showing how S-parameters vary with frequency for particular implementations of an interface circuit and of conventional circuitry.
Figure 5B:
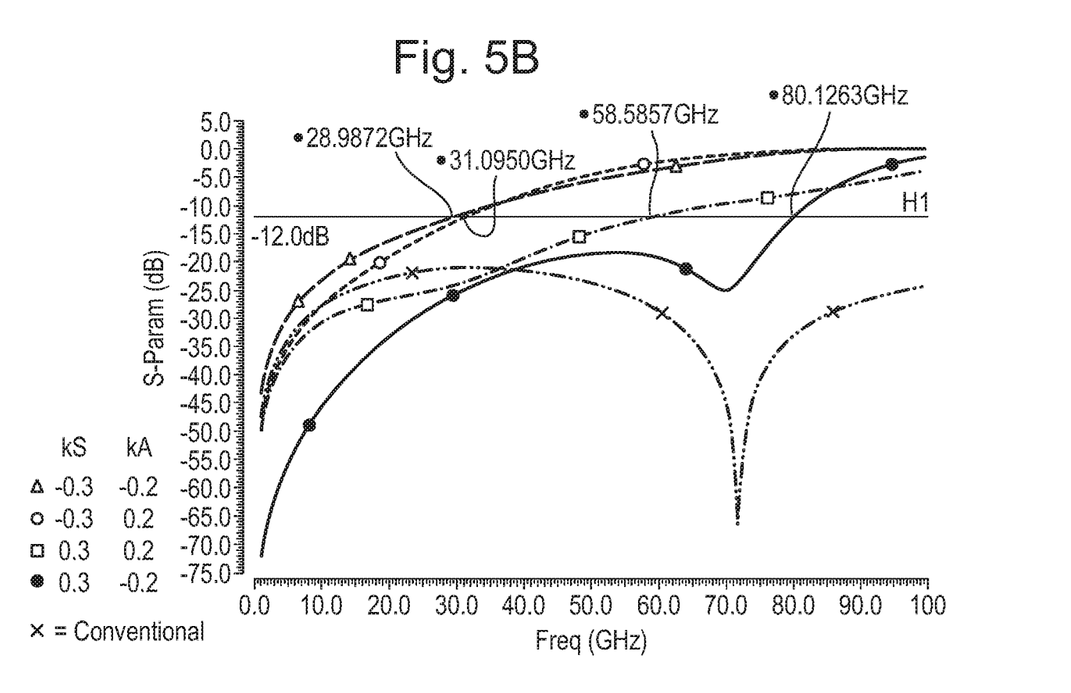

FIG. 5A is a graph that shows how the S21 parameter changes with frequency for particular implementations of the interface circuit 100 compared with a conventional circuit (corresponding to the conventional circuit mentioned earlier). FIG. 5B is a graph that shows how the S22 parameter changes with frequency for the same implementations of the interface circuit 100 compared with the conventional circuit.

In FIGS. 5A and 5B, the lines with the triangles show the S-parameters for a particular implementation of the interface circuit 100 in which kS is −0.3 and kA is −0.2, i.e. kS negative and kA negative. The lines with the empty circles show the S-parameters for a particular implementation of the interface circuit 100 in which kS is −0.3 and kA is 0.2, i.e. kS negative and kA positive. The lines with the squares show the S-parameters for a particular implementation of the interface circuit 100 in which kS is 0.3 and kA is 0.2, i.e. kS positive and kA positive. The lines with the filled circles show the S-parameters for a particular implementation of the interface circuit 100 in which kS is 0.3 and kA is −0.2, i.e. kS positive and kA negative. The lines with the crosses show the S-parameters for the conventional circuit.

The differences between FIGS. 5A and 5B and FIGS. 4A and 4B are due to the choice of parameters for the implementations used to generate the graphs (e.g. the representative capacitance of the signal-handling circuit 120 and the auxiliary circuit 140, the inductance of the inductors 15, 25, 35 and 45, and the resistance of the termination resistor 180).

In FIG. 5A the level of −3 dB for S21 has been marked on, and in FIG. 5B, the level of −12 dB for S22 (and S11) has been marked on. It can be seen from FIGS. 5A and 5B that the implementation that gives the widest bandwidth (the range of signal frequencies with an S21 value above −3 dB and with an S22 value below −12 dB) is the one in which kS is 0.3 and kA is −0.2 (this implementation has a bandwidth of approximately 80 GHz—the S21 parameter drops below −3 dB at approximately 92 GHz and the S22 parameter rises above −12 dB at approximately 80 GHz).

It can also be seen from FIGS. 5A and 58 that the conventional circuit in this implementation has a bandwidth of approximately 64 GHz.

Although the graphs in FIGS. 3 to 5B show the S22 parameter, graphs showing the S11 parameter would be similar and so are not shown. The graphs in FIGS. 3 to 5B relate to the output stage depicted in FIG. 1A, however it will be appreciated that similar graphs would be obtained based on the input stage interface circuit 101 of FIG. 1B.

Although described above as being implemented as single-ended circuitry, the interface circuit 100 may also be implemented as differential circuitry. In this case, interface circuit 100 could be considered to be "mirrored" about RF GND in FIG. 1A. Similar considerations of course apply to interface circuit 101 of FIG. 1B.

Figure 6:
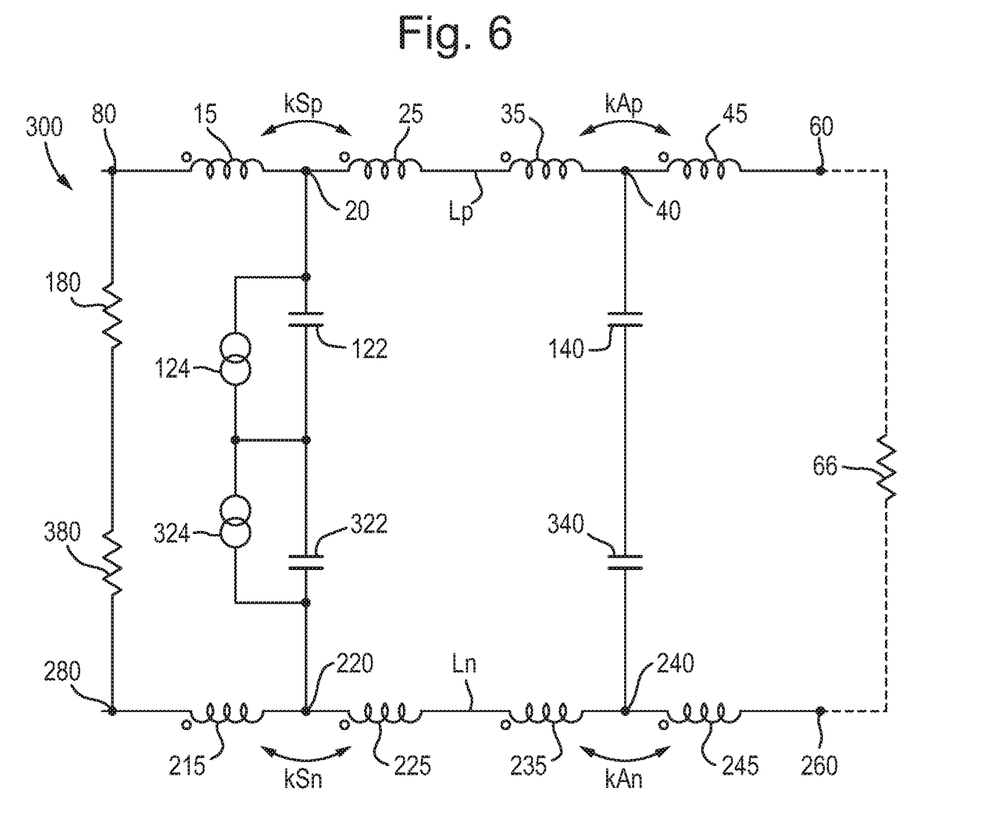
FIG. 6 is a schematic diagram of differential interface circuitry.

FIG. 6 is a schematic diagram of a differential interface circuit 300. Differential interface circuit 300 comprises a first interface circuit and a second interface circuit. The first interface circuit can be taken to be the interface circuit 100 illustrated in FIG. 1 (ignoring for the moment the grounding of the interface circuit 100), taking its signal line L to be a positive signal line Lp and the coefficients kS and kA to be kSp and kAp (i.e. related to the signal line Lp).

The second interface circuit comprises a negative signal line Ln corresponding with the positive signal line Lp of the first interface circuit 100. The negative signal line Ln comprises nodes corresponding to those of the positive signal line Lp. The second interface circuit comprises circuitry corresponding to that of the first interface circuit 100 (i.e. the second interface circuit comprises second termination resistor 380, second signal-handling circuitry 320, second auxiliary circuit 340, a signal pair of inductors 215 and 225 with a coupling coefficient kSn, and an auxiliary pair of inductors with a coupling coefficient kAn) and a detailed description thereof is omitted.

The first termination resistor 180 is connected to the second termination resistor 380 (collectively a termination resistor for the differential interface circuit 300). Similarly, the first signal-handling circuitry 120 is connected to the second signal-handling circuitry 320 (collectively signal-handling circuitry for the differential interface circuit 300).

Further, the first auxiliary circuit 140 is connected to the second auxiliary circuit 340 (collectively an auxiliary circuit for the differential interface circuit 300).

The first connection node 60 and the second connection node 260 are for connecting to a differential transmission line.

The circuitry shown in dotted lines (representative resistor 66) shows circuitry that could be used (for example in a simulation) to represent the input stage on the other side of the transmission line to be connected at the first and second connection nodes 60 and 260.

It will be appreciated that the differential interface circuit 300 could be modified for implementation in an input stage. For example, similarly to the interface circuit 101 shown in FIG. 1B, the first and second signal handling circuits 120 and 320 could each comprise buffer circuitry for together receiving a differential signal.

Figure 7A:
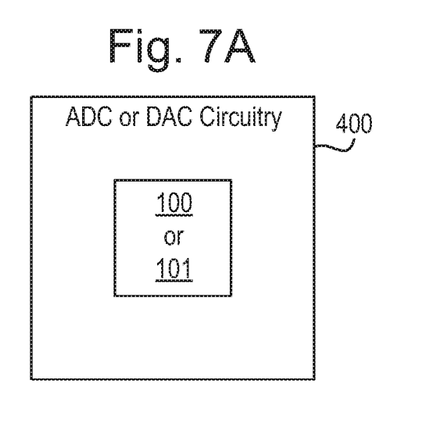
FIGS. 7A and 7B are schematic diagrams of ADC or DAC circuitry.
Figure 7B:
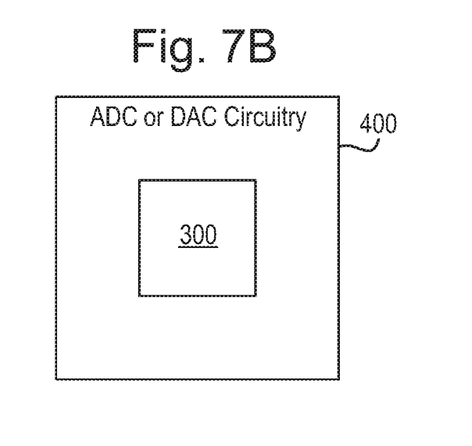

The interface circuit 100, 101 and/or the differential interface circuit 300 embodying the present invention could be implemented in and/or along with mixed-signal circuitry such as DAC or ADC circuitry, as mentioned above. For example, the interface circuit 100, 101 and/or the differential interface circuit 300 embodying the present invention could be implemented in and/or along with DAC circuitry 400 (or, in another example, ADC circuitry 400), as illustrated in FIG. 7A and FIG. 7B.

In summary, by splitting the capacitance at the driver's output node into multiple smaller capacitances, each can be compensated by a separate T-coil and optimized for wideband S22 and S21 (or S11 and S21). In the case of using two T-coils as in FIGS. 1A and 1B, it is advantageous for kS to be positive and kA to be negative, both with respect to the dot convention employed herein. This choice makes the bandwidth performance of both S21 and S22/S11 as close to optimum as possible. The interface circuit 100 can also generate peaking to equalize any roll off behaviour caused by the preceding stages e.g. the sinc(x) behaviour of the DAC.

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The invention claimed is:

1. An interface circuit, comprising:
a signal line having signal, auxiliary and connection nodes defined therealong, the connection node for connection to a transmission line;
signal-handling circuitry connected to the signal line at the signal node so that an effective capacitance of the signal-handling circuitry is experienced at the signal node;
an auxiliary circuit connected to the signal line at the auxiliary node so that an effective capacitance of the auxiliary circuit is experienced at the auxiliary node;
a signal pair of inductors connected in series along the signal line adjacent to and on either side of the signal node; and
an auxiliary pair of inductors connected in series along the signal line adjacent to and on either side of the auxiliary node,
wherein:
the signal pair of inductors are configured to have a mutual coupling defined by a coupling coefficient kS;
the auxiliary pair of inductors are configured to have a mutual coupling defined by a coupling coefficient kA;
for each said pair of inductors, the inductors of the pair are arranged such that a current flowing along the signal line in a given direction through one of those inductors induces a current in the other one of those inductors and flowing in the same direction along the signal line given a positive coupling coefficient; and
kS has a positive value and kA has a negative value.

2. The interface circuit according to claim 1, wherein:
the auxiliary node is defined along the signal line between the signal and connection nodes; or
the signal pair of inductors is connected along the signal line adjacent to the auxiliary pair of inductors; or
the auxiliary pair of inductors is connected along the signal line adjacent to the connection node.

3. The interface circuit according to claim 1, wherein the auxiliary circuit is an electrostatic discharge protection circuit.

4. The interface circuit according to claim 1, wherein:
kS and kA both have a magnitude greater than 0.1; or
kS and kA both have a magnitude between 0.1 and 0.4.

5. The interface circuit according to claim 1, wherein the effective capacitance of the signal-handling circuitry is larger than the effective capacitance of the auxiliary circuit, the inductances of the signal pair of inductors are larger than the inductances of the auxiliary pair of inductors, and the magnitude of kS is greater than the magnitude of kA.

6. The interface circuit according to claim 1, wherein the signal line further has a termination node defined therealong, and the interface circuit comprises a termination resistor connected to the signal line at the termination node, or
wherein the termination node is defined along the signal line on the opposite side of the signal node from the auxiliary node.

7. The interface circuit according to claim 1, wherein the interface circuit is a differential circuit comprising positive and negative said signal lines each having its own set of the signal, auxiliary and connnection nodes and the signal and auxiliary pairs of inductors, and connected to a differential transmission line at the connection nodes of the positive and negative signal lines,
wherein the coupling coefficients for the pairs of inductors of the positive signal line the same polarities as the corresponding coupling coefficients for the corresponding pairs of inductors of the negative signal line.

8. The interface circuit according to claim 1, wherein the signal-handling circuitry is:
driver circuitry for driving an output signal on the signal line; or
buffer circuitry for receiving an input signal from the signal line.

9. An output circuit for use in digital-to-analogue converter circuitry, the output circuit comprising the interface circuit according to claim 1.

10. Digital-to-analogue converter circuitry comprising an output circuit, the output circuit comprising the interface circuit according to claim 1.

11. An input circuit for use in analogue-to-digital converter circuitry, the input circuit comprising the interface circuit according to claim 1.

12. Analogue-to-digital converter circuitry comprising an input circuit, the input circuit comprising the interface circuit according to claim 1.

13. Integrated circuitry comprising the interface circuit according to claim 1.

14. The integrated circuitry of claim 13, wherein the integrated circuitry comprises an IC chip.

15. Integrated circuitry comprising an output circuit for use in digital-to analogue converter circuitry, the output circuit comprising the interface circuit according to claim 1.

16. Integrated circuitry comprising digital-to-analogue converter circuitry, the digital-to-analogue converter circuitry comprising an output circuit, the output circuit comprising the interface circuit according to claim 1.

17. Integrated circuitry comprising an input circuit for use in analogue-to-digital converter circuitry, the input circuit comprising the interface circuit according to claim 1.

18. Integrated circuitry comprising analogue-to-digital converter circuitry, the analogue-to-digital converter circuitry comprising an input circuit, the input circuit comprising the interface circuit according to claim 1.

19. A signal transmission system,
comprising: a transmission line having first and second ends;
a first interface circuit connected to the transmission line at its first end; and
a second interface circuit connected to the transmission line at its second end;
wherein each of the first interface circuit and the second interface circuit comprises:
a signal line having signal, auxiliary and connection nodes defined therealong, the connection node for connection to the transmission line;
signal-handling circuitry connected to the signal line at the signal node so that an effective capacitance of the signal-handling circuitry is experienced at the signal node;
an auxiliary circuit connected to the signal line at the auxiliary node so that an effective capacitance of the auxiliary circuit is experienced at the auxiliary node;
a signal pair of inductors connected in series along the signal line adjacent to and on either side of the signal node; and
an auxiliary pair of inductors connected in series along the signal line adjacent to and on either side of the auxiliary node,
wherein:
the signal pair of inductors are configured to have a mutual coupling defined by a coupling coefficient kS;
the auxiliary pair of inductors are configured to have a mutual coupling defined by a coupling coefficient kA;
for each said pair of inductors, the inductors of the pair are arranged such that a current flowing along the signal line in a given direction through one of those inductors induces a current in the other one of those inductors and flowing in the same direction along the signal line given a positive coupling coefficient; and
kS has a positive value and kA has a negative value.

20. Integrated circuitry comprising the signal transmission system to claim 19.

* * * * *